United States Patent [19]
Ikeda

[11] Patent Number: 5,761,142
[45] Date of Patent: Jun. 2, 1998

[54] SEMICONDUCTOR MEMORY DEVICE HAVING SENSE AMPLIFIER DRIVERS DISPOSED ON CENTER PORTION OF CELL ARRAY BLOCK

[75] Inventor: Minari Ikeda, Tokyo, Japan

[73] Assignee: NEC Corporation, Tokyo, Japan

[21] Appl. No.: 871,132

[22] Filed: Jun. 6, 1997

[30] Foreign Application Priority Data

Jun. 7, 1996 [JP] Japan ................. 8-146111

[51] Int. Cl.$^6$ ..................... G11C 7/00
[52] U.S. Cl. ............ 365/207; 365/205; 365/208; 365/51
[58] Field of Search ................ 365/205, 207, 365/208, 230.03, 51, 63

[56] References Cited

U.S. PATENT DOCUMENTS 5,555,210 9/1996 Kato ........................ 365/205
5,602,772 2/1997 Nakano ..................... 365/51
5,644,525 7/1997 Takashima ................. 365/51

FOREIGN PATENT DOCUMENTS 6-275064 9/1994 Japan.

Primary Examiner—David C. Nelms
Assistant Examiner—Son Mai
Attorney, Agent, or Firm—Sughrue, Mion, Zinn, Macpeak & Seas, PLLC

[57] ABSTRACT

A semiconductor memory device includes a plurality of sense amplifiers which are divided into two groups. There are provided drive wires each extending to an associated one of the sense amplifier groups and being used to independently drive the associated group. The length of each drive wire being thereby reduced up to a half, to operated at a high speed.

4 Claims, 6 Drawing Sheets

5,761,142

SEMICONDUCTOR MEMORY DEVICE HAVING SENSE AMPLIFIER DRIVERS DISPOSED ON CENTER PORTION OF CELL ARRAY BLOCK

BACKGROUND OF THE INVENTION

The present invention relates to a semiconductor memory device and, memory particularly, to an improvement in layout of sense amplifier dividers for a Dynamic Random Access Memory (DRAM).

Generally, a DRAM is required to be enlarged in memory capacity more and more. To cope with such a trend, a minimum design standard of 0.6 μm or less is demanded.

As fine patterns of the DRAM is developed, not only are small memory cells required, but also the wiring used when connecting memory cells, the sense amplifier drive wires used when connecting sense amplifiers, which amplify signals from memory cells, to sense amplifier drivers, which drive the sense amplifiers, word lines, bit lines, etc., must be narrowed. Especially required is that all the sense amplifiers be driven at substantially the same voltage in order to stably operate sense amplifiers, and for this, resistance along the sense amplifier drive wires must be small.

In order to reduce resistance across the sense amplifier drive wires, Japanese Laid-Open (Kokai) Patent Publication No. Hei 6-275064 discloses a DRAM wherein provided are a memory array area in which are a plurality of memory cells, a pair of sense amplifier drive wires extending in one direction, and two sense amplifier drivers that are to be connected to the respective sense amplifier drive wires, and wherein the two sense amplifier drivers are located on either side of the memory cell array area. Further, in this example, drive bus wires extend perpendicularly from the sense amplifiers to the sense amplifier wires, and are connected to the respective sense amplifier wires.

With this arrangement, compared with one where the drive bus is extended from the sense amplifier driver that is located on only one side of the memory array area, multiple drive bus wires can be arranged, and as a result, parasitic resistance along the sense amplifier driving signal lines can be reduced.

In this structure, however, since the individual sense amplifiers are connected to the sense amplifiers via the drive bus wires, in addition to being connected via the sense amplifier drive wires, resistance along the drive wires, including the drive bus wires, can be reduced, even though the parasitic resistance along the sense amplifier drive wires can be lowered.

Using a multi-layer structure for the wiring can not be avoided, because of the highly integrated, dense structure employed for the memory cells. If aluminum, which is used for surface wiring, were employed in this case, it would be easily affected by thermal processing. Aluminum, therefor, is not suitable for use in a multi-layer structure.

A wiring arrangement using tungsten has also been studied as a means by which to provide multi-layered wiring and to reduce the number of procedures. More specifically, to cover a contact hole, wiring with the tungsten that is normally used has been discussed. If this arrangement can be implemented, it will not be necessary for tungsten that is deposited on and covers the contact hole to be removed by etching, and the number of procedures can be reduced.

However, since the resistivity of tungsten is three times that of aluminum, tungsten wiring having three times the width of aluminum wiring is required to acquire the same resistance as that obtained with aluminum wiring. Therefore, when tungsten wiring is used, fabrication of a semiconductor memory device having a highly integrated structure can not be expected, nor can high speed processing be expected.

SUMMARY OF THE INVENTION

It is, therefore, one object of the present invention to provide a semiconductor memory device that can reduce resistance between sense amplifiers and sense amplifier drivers.

It is another object of the present invention to provide a semiconductor memory device for which multi-layered wiring can be used.

It is still another object of the present invention to provide a semiconductor memory device for which tungsten can be used as a wiring material and that is not affected by the resistivity of tungsten.

A semiconductor memory device according to the present invention has a plurality of memory blocks and at least one of blocks includes a plurality of memory cells, a plurality of sense amplifiers which are divided into first and second groups. Each sense amplifier in the first group is activated or driven by a first sense-enable signal, and each sense amplifier in the second group is activated or driven by a second sense-enable signal. To convey the first and second sense-enable signals, there are provided first and second wiring layers independently of each other. There is further provided a driver circuit between the first and second wiring layers.

In a preferred embodiment, the driver circuit included first and second drivers. The first driver generates the first sense-enable signal, and the second driver generates the second sense-enable signal.

In another preferred embodiment, the driver circuit include a driver and a selector. This selector selects a signal from the driver as the first sense-enable signal in a first state and as the second sense-enable signal in a second state.

The above construction, the length of each wiring layers can be reduced by substantially a half. Accordingly, a relatively high-resistance metal such as tungsten can be used for the drive wires.

BRIEF DESCRIPTION OF THE DRAWINGS

The above and other objects, features and advantages of the present invention will be apparent from the following description taken in conjunction with the accompanying drawings, in which.

DETAILED DESCRIPTION OF THE PREFERRED EMBODIMENTS

Figure 1A:
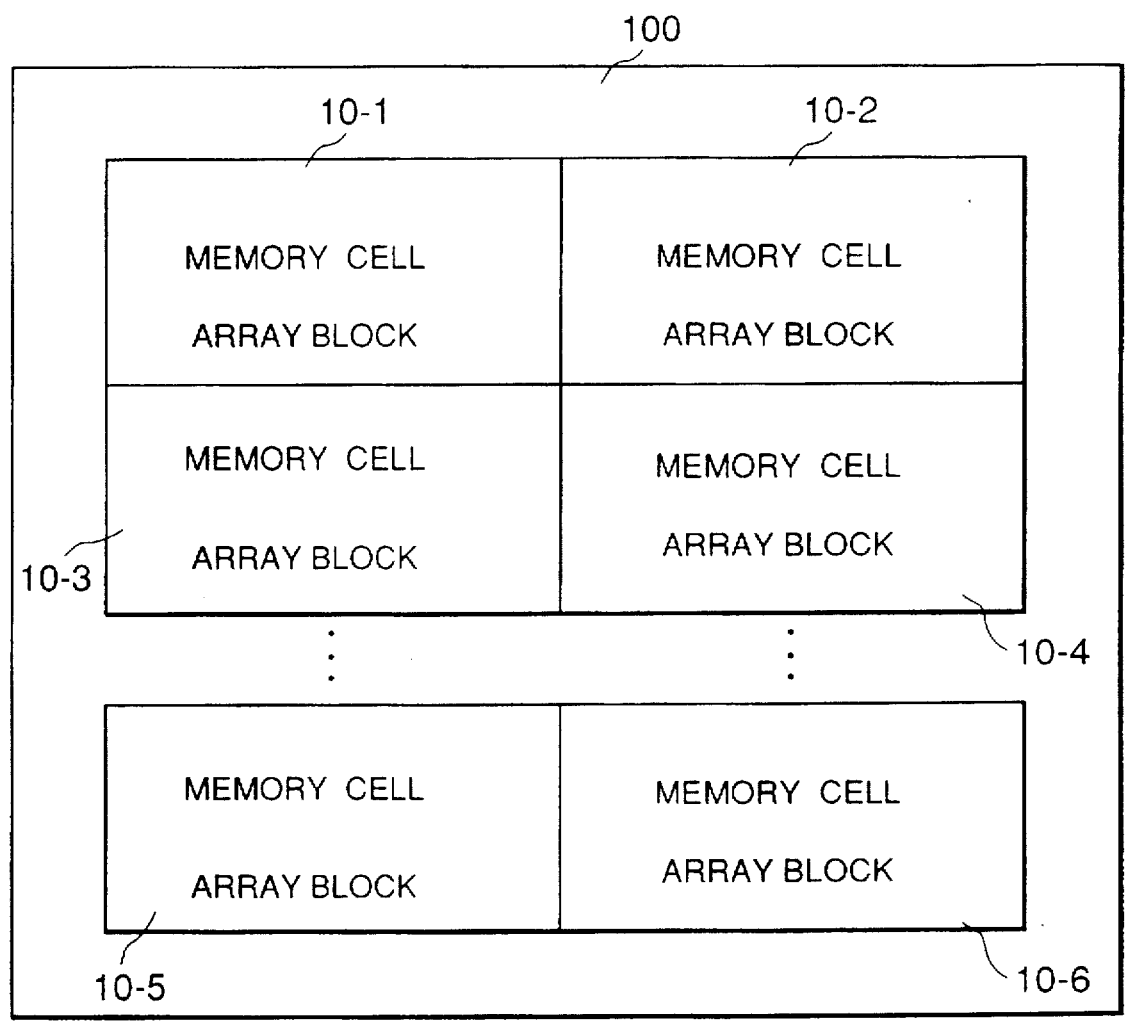
FIG. 1A is a layout diagram illustrative of a DRAM chip and FIG. 1B is a plan view illustrative of a pattern layout of one cell array block in the DRAM chip according to one embodiment of the present invention.

Referring now to FIG. 1A. a DRAM according to the first embodiment of the present invention includes a plurality of unit memory cell array blocks 10-1 to 10-6 arranged in plural rows and two columns. Each of the blocks 10 includes a great number of memory cells to provide a 64 M-bits or 256 M-bits DRAM in total.

Since each of the memory blocks 10-1 to 10-6 are the same as one another in circuit construction and pattern layout, the description will be made below on the memory block 10-1 with reference to FIG. 1B.

Figure 1B:
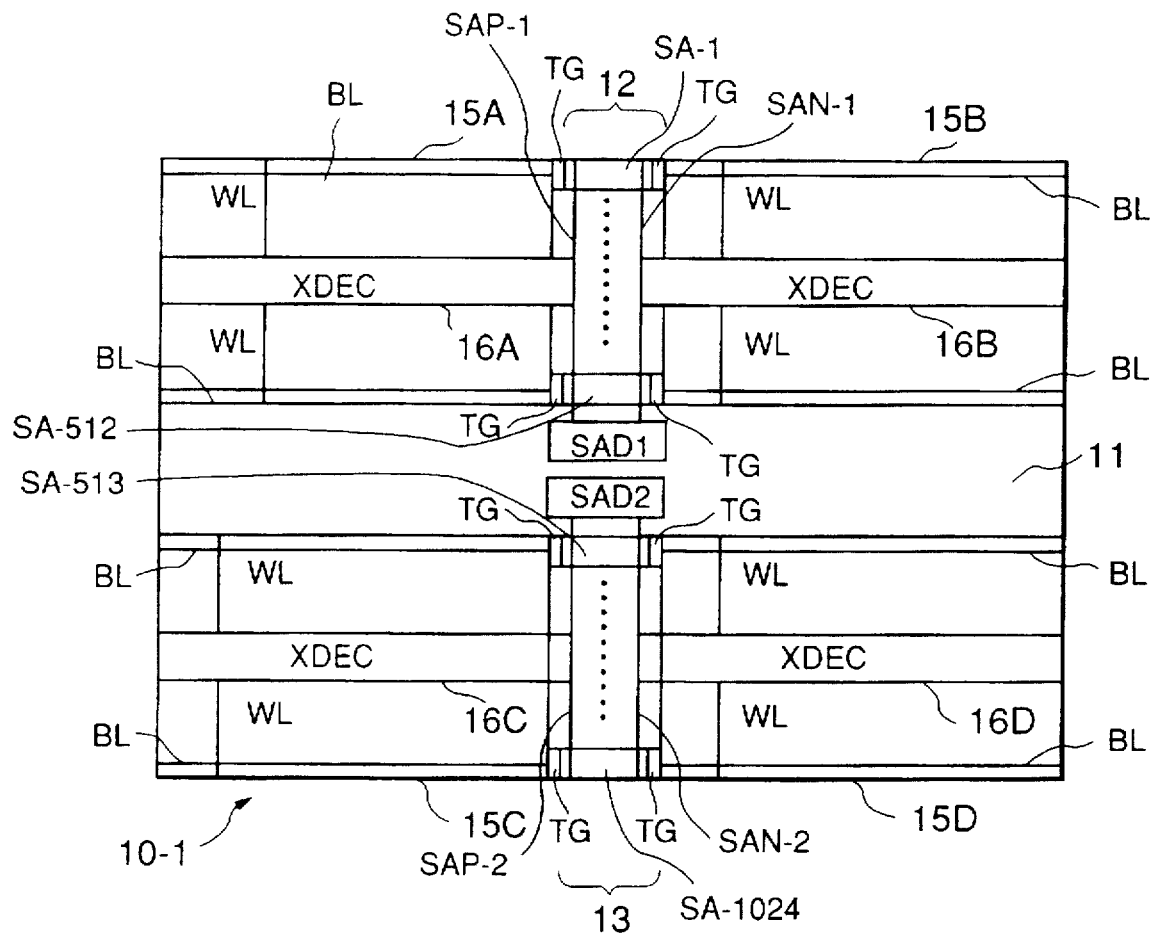

In FIG. 1B, the unit memory block 10 includes a plurality of memory cells and peripheral circuits such as sense amplifiers associated with the cells. Therefore, the unit memory block 10 can be also regarded as one memory cell array.

In this description, the unit memory block 10-1 has 1024 pairs of bit lines in total, so that 1024 sense amplifiers SA-1 to SA-1024 are provided and coupled to an associated one bit lines BL. These sense amplifiers are driven or activated by a pair of sense-enable signal lines SAN and SAP.

In this connection, it should be noted that the memory block 10-1 is divided into four sub-blocks composed of a left-upper one 15A, a right-upper one 15B, a left-lower one 15C and a right-lower one 15D. Consequently, such a cross-chape area is define that includes a first area 11, a second area 12 sandwitched between sub-blocks 15A and 15B, and a third area 13 sandwitched between the sub-blocks 15C and 15D. 512 sense amplifiers SA-1 to SA-512 are arranged in the second area 12, and 512 sense amplifiers SA-513 to SA-1024 are provided in the third area 13. The sense amplifiers SA-1 to SA-512 are driven in common by the sense-enable signals SAP-1 and SAN-1, and the other sense amplifiers SA-513 to SA-1024 are driven by the sense-enable signals SAP-2 and SAN-2.

It is further noted that this memory is of a shared-sense amplifier type. That is, the memory cells in the sub-block 15A and those in the sub-block 15B share the sense amplifiers SA-1 to SA-512. Similarly, the memory cells in the sub-block 15C and those in the sub-block 15D share the sense amplifiers SA-513 to SA-1024. Accordingly, there are further provided transfer gates on both sides of each sense amplifier SA to select either one of the sub-block 15A (15C) and 15B (15D).

While the areas 11 to 13 is relatively depicted to occupy a large area, these areas are much narrower than each sub-block 15.

In accordance further with the present invention, first and second sense amplifier drivers SAD1 and SAD2 are positioned in the center of the first area 11. The driver SAD1 is provided to control the levels of the lines SAP-1 and SAN-1 for the sense amplifiers SA-1 to SA-512, and the driver SAD2 is provided to control the levels of the lines SAP-2 to SAN-2 for the sense amplifiers SA-513 to SA-1024. Thus, these two, first and the second sense amplifier drivers SAD1 and SAD2 are provided to two sets of sense amplifiers SA, respectively.

Although not shown in FIG. 1B, a pair of transfer gate drivers are provided in the vacant area of the first area 11. On of those drivers controls the ON/OFF of the transfer gates TG on the left side of each sense amplifier SA, and the other of them controls the ON/OFF of the transfer gates TG on the right side of each sense amplifier SA.

In the sub-blocks 15A to 15D, X or row decoders XDEC16A through XDEC16D are so arranged that they extend latitudinally in the center of the first through the fourth cell segment areas 15A through 15D. In the. X decoders XDEC16A through XDEC16D. word lines WL extend vertically in parallel with the sense amplifier drive wires. The sense amplifiers are connected to bit lines that are so extended that they intersect the word lines, and the outputs of the sense amplifiers are transmitted to the bit lines.

Figure 2:
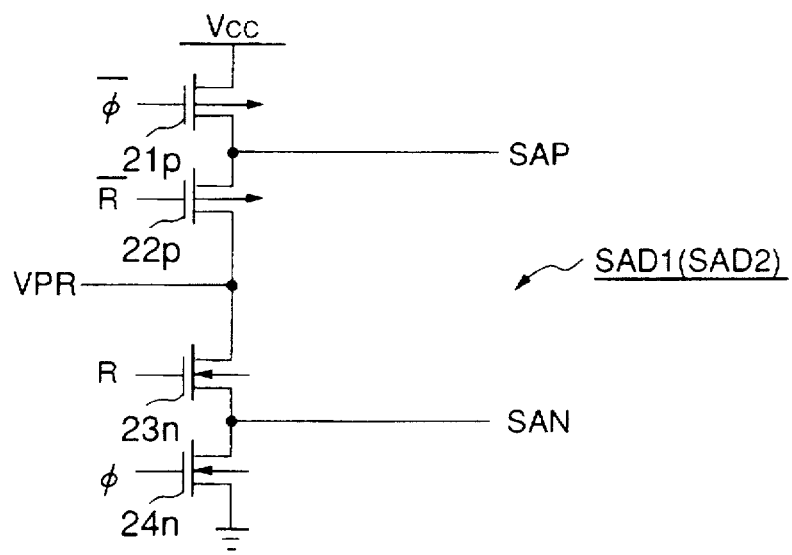
FIG. 2 is a circuit diagram indicative of one sense amplifier driver SAD1 (SAD2) shown in FIG. 1.

Referring to FIG. 2, each of the sense amplifier drivers SAD1 and SAD2 includes two P-channel MOS transistors $21p$ and $22p$ and two N-channel MOS transistors $23n$ and $24n$, which are connected between a power source line VCC and the ground. The source of the P channel MOS transistor $21p$ is connected to the power source, and its drain is connected to the source of the P channel MOS transistor $22p$. A sense amplifier driving signal SAP is output at the common connection point for the P channel MOS transistors $21p$ and $22p$. The drain of the P channel MOS transistor $22p$ is connected to the drain of the N channel MOS transistor $23n$. The source of the N channel MOS transistor $24n$ is connected to the drain of the N channel MOS transistor $24n$. The source of the N channel MOS transistor $24n$ is grounded. As is shown in the diagram, a sense amplifier driving signal SAN is output at the common connection point for the N channel MOS transistors $23n$ and $24n$.

A precharge voltage VPR of (½) VCC is applied to the common connection point for the P channel MOS transistor $22p$ and the N channel MOS transistor $23n$.

Further, sense amplifier driving circuit enable signals $\bar{\phi}$ and $\phi$ which are mutually inverted are supplied to the gates of the P channel MOS transistor $21p$ and the N channel transistor $24n$, while enable signals $\bar{R}$ and R are supplied to the gates of the transistors $22p$ and $23n$.

When sense amplifier driving circuit enable signals $\bar{\phi}$ and $\phi$ are transmitted to the P channel MOS transistor $21p$ and the N channel MOS transistor $24n$, while the signals $\bar{R}$ and R are being supplied to the gates of the transistors $22p$ and $23p$, the individual transistors are rendered on, and sense amplifier driving signals SAP and SAN are output that have polarities opposite to the precharge voltage (½) VCC.

Figure 3:
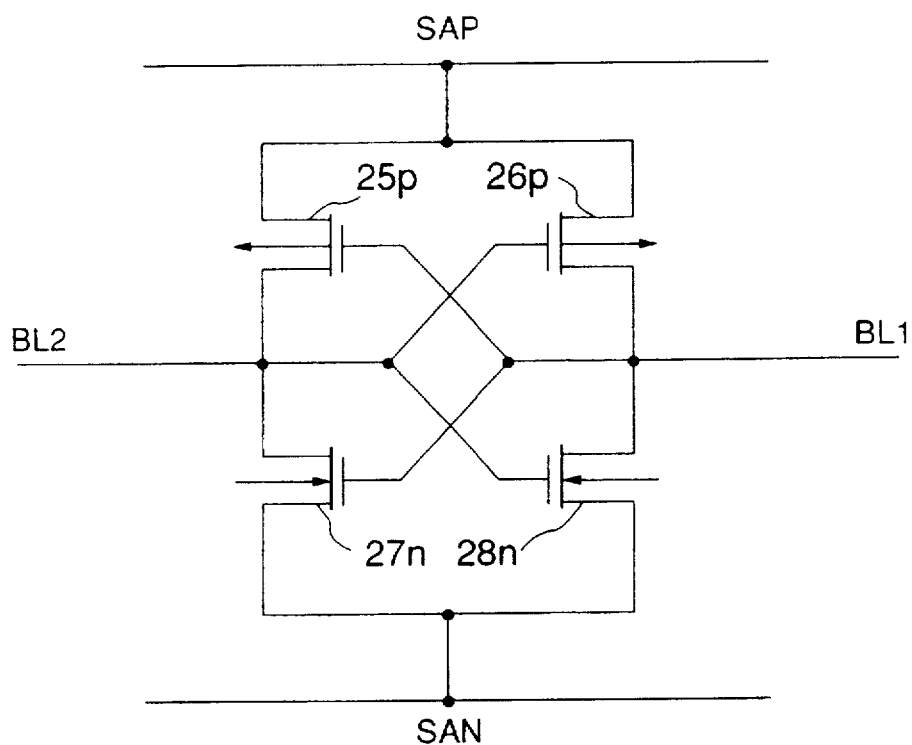
FIG. 3 is a circuit diagram indicative of one sense amplifier employed in the DRAM shown in FIG. 1.

As shown in FIG. 3, each of the sense amplifiers SA receiving these sense amplifier driving signals SAP and SAN includes a flip-flop circuit having two P-channel MOS transistors $25p$ and $26p$ and two N-channel MOS transistors $27n$ and $28n$. In the flip-flop circuit, the sources of the P channel MOS transistors $25p$ and $26p$ are connected together; the drains of the P-channel MOS transistors $25p$ and $26p$ are connected to the drains of the N channel MOS transistors $27n$ and $28n$; and the sources of the N channel MOS transistors $27n$ and $28n$ are connected together. The gates of the P channel and N channel MOS transistors $25p$ and $27n$ are connected together, and the common gate connection is connected to the common drain connection for the P channel and N channel MOS transistors $26p$ and $28n$, communicating with the bit line BL1. Similarly, the gates of the P channel and N channel MOS transistors $26p$ and $28n$ are connected together, and the common gate connection is connected to the common drain connection for the P channel and N channel MOS transistors $25p$ and $27n$, communicating with the bit line BL2. The bit lines BL1 and BL2 are precharged at (½) VCC. Upon receipt of the sense amplifier driving signals SAP and SAN, output signals are transmitted across the bit lines BL1 and BL2 in consonance with the contents stored in a cell that is connected to a selected word line.

In FIG. 1, the sense amplifier drivers SAD1 and SAD2 employ the sense amplifier driver shown in FIG. 2. In the middle area 11 on a chip are provided wiring for supplying signals R, $\overline{R}$, $\phi$ and $\overline{\phi}$, which are required by the sense amplifier drivers SAD1 and SAD2, a precharge signal VPR, and a power voltage VCC.

In this embodiment, two sense amplifier drivers SAD1 and SAD2 are provided in the unit memory block 10. The sense amplifier drivers SAD1 and SAD2 drive the sense amplifiers (e.g., 1024 sense amplifiers) that are divided and arranged in the memory block 10.

The length of the sense amplifier drive wires that extend vertically from the two sense amplifier drivers SAD1 and SAD2 can be reduced by half, compared with when a single sense amplifier driver is used. This means that the delay affecting the sense amplifiers that are located farthest from the sense amplifier drivers SAD1 and SAD2 can also be reduced by half.

Since the length of the sense amplifier drive wires can be reduced, tungsten having a higher resistivity $\rho$ than aluminum can be used for sense amplifier drive wires. When tungsten can be used as sense amplifier drive wires, the number of procedures is reduced, when compared with the number required when aluminum is employed.

More specifically, sputtering with tungsten is usually employed merely to cover a contact hole, whereas aluminum is used for wiring at the contact hole because of its resistivity $\rho$. However, if the length of the sense amplifier drive wire can be reduced as is shown in FIG. 1, tungsten can be employed not only in the contact hole but also for the wiring. Conventionally, before a contact hole is buried, an etching procedure is required to remove the tungsten that remains on a substrate, but if tungsten is also used for the wiring, the etching procedure can be eliminated and the number of procedures can be reduced.

Figure 4:
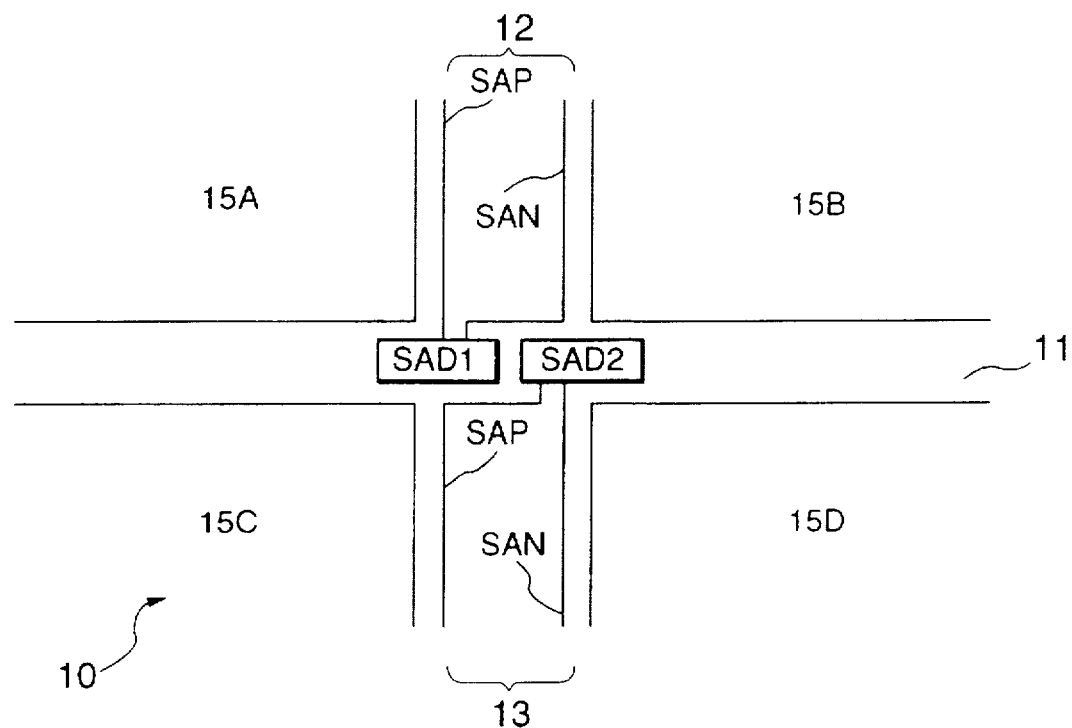
FIG. 4 is an enlarged diagram illustrative of one part of a semiconductor memory device according to another embodiment of the present invention.

In FIG. 4, a semiconductor memory device according to another embodiment of the present invention has two sense amplifier drivers SAD1 and SAD2 arranged in parallel in a middle area 11 in a memory block 10. A pair of driver drive wires is led upward in the diagram from the sense amplifier driver SAD1, while a pair of driver drive wires is led downward from the sense amplifier driver SAD2. Sense amplifier driving signals SAP and SAN are output across the respective pairs of driver drive wires. In this embodiment, since the two sense amplifier drivers SAD1 and SAD2 are arranged in parallel in the middle area in the memory block 10, the middle area can be effectively utilized, compared with the arrangement in the embodiment shown in FIG. 1.

Figure 5:
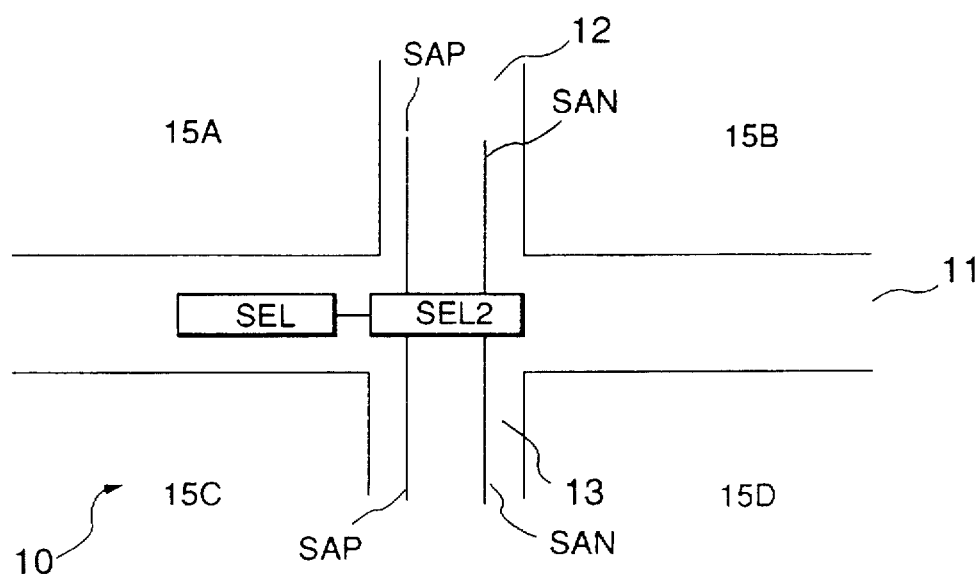
FIG. 5 is a diagram illustrative of one part of a semiconductor memory device according to a still another embodiment of the present invention.

A semiconductor memory device according to an additional embodiment of the present invention will be described while referring to FIGS. 5 and 6. In this embodiment, a single sense amplifier driver SAD and a selector SEL are positioned in a middle area 11, as is shown in FIG. 5, so that the output of the sense amplifier driver SAD is selected by the selector SEL. In this case, sense amplifier driving signals SAP and SAN are switched by the selector SEL and are selectively transmitted to first and second sense amplifier areas 12 and 13.

Figure 6:
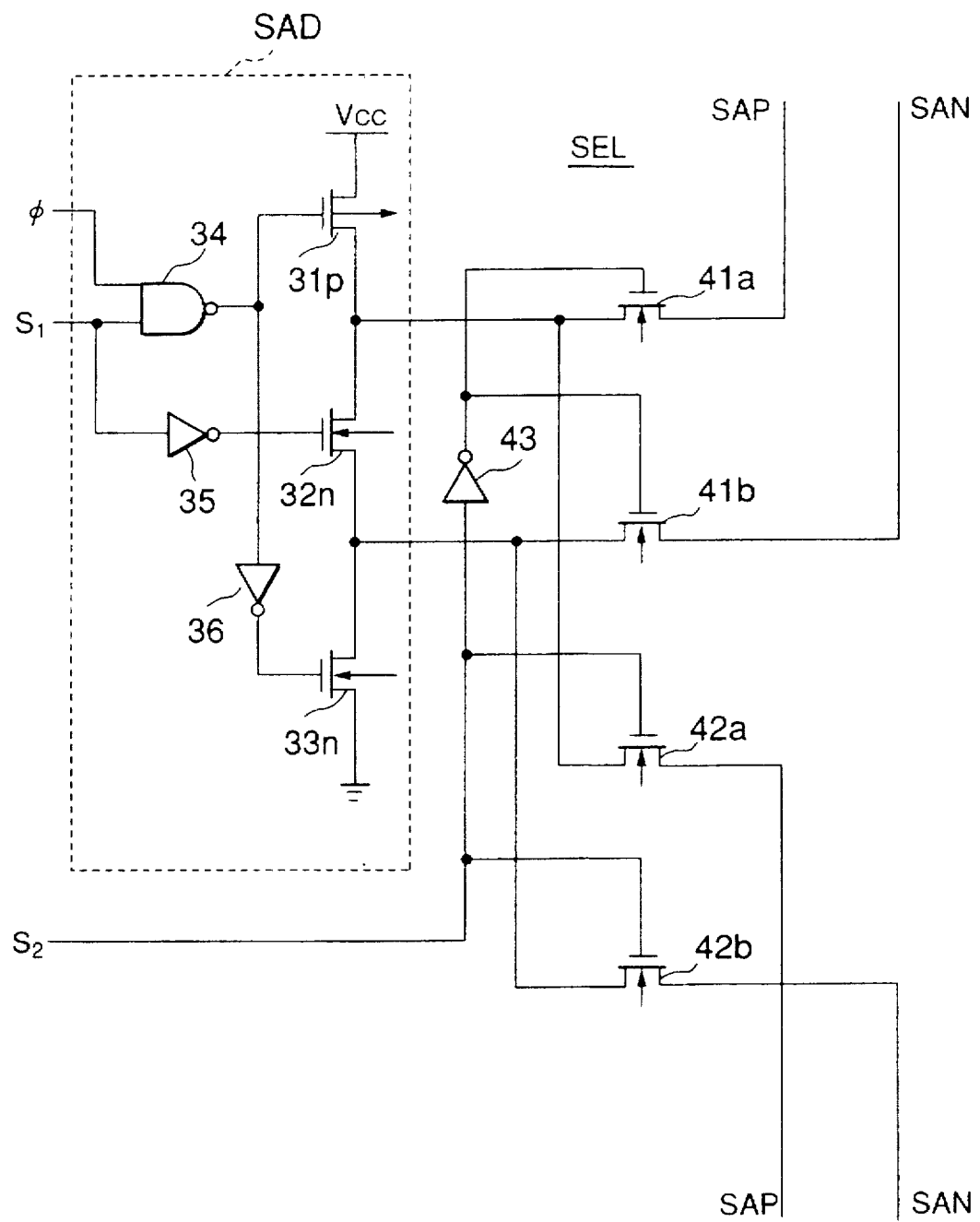
FIG. 6 is a circuit diagram indicative of a sense amplifier driver SAD and a selection circuit SEL shown in FIG. 5.

A specific example of a combination of the sense amplifier driver SAD and the selector SEL is shown in FIG. 6. A sense amplifier drive circuit enable signal $\phi$ and a driver selection signal S1 are supplied to the sense amplifier driver SAD, while a drive wire selection signal S2 is supplied to the selector SEL. The sense amplifier driver SAD includes a P channel MOS transistor 31p, two N channel MOS transistors 32n and 33n, a NAND gate 34 and inverters 35 and 36.

As is apparent from FIG. 6, in accordance with the sense amplifier drive circuit enable signal $\phi$ and the driver selection signal S1, the sense amplifier driver SAD outputs the sense amplifier driving signals SAP and SAN to the ends of the N channel MOS transistor 32n.

The selector SEL comprises two pairs of N channel transistors 41a and 41b, and 42a and 42b, which are connected to the ends of the N channel MOS transistor 32n. The drive wire selection signal S2 is transmitted via the inverter 43 to the gates of the N channel MOS transistors 41a and 41b, and is transmitted directly to the gates of the N channel MOS transistors 42a and 42b.

In this arrangement, when the drive wire selection signal S2 carries a logical "1", the sense amplifier driving signals SAP and SAN are transmitted via the N channel MOS transistors 42a and 42b to the second sense amplifier area 13. When the drive wire selection signal S2 carries a logical "0", the sense amplifier driving signals SAP and SAN are transmitted via the N channel MOS transistors 41a and 41b to the first sense amplifier area 12.

Figure 7:
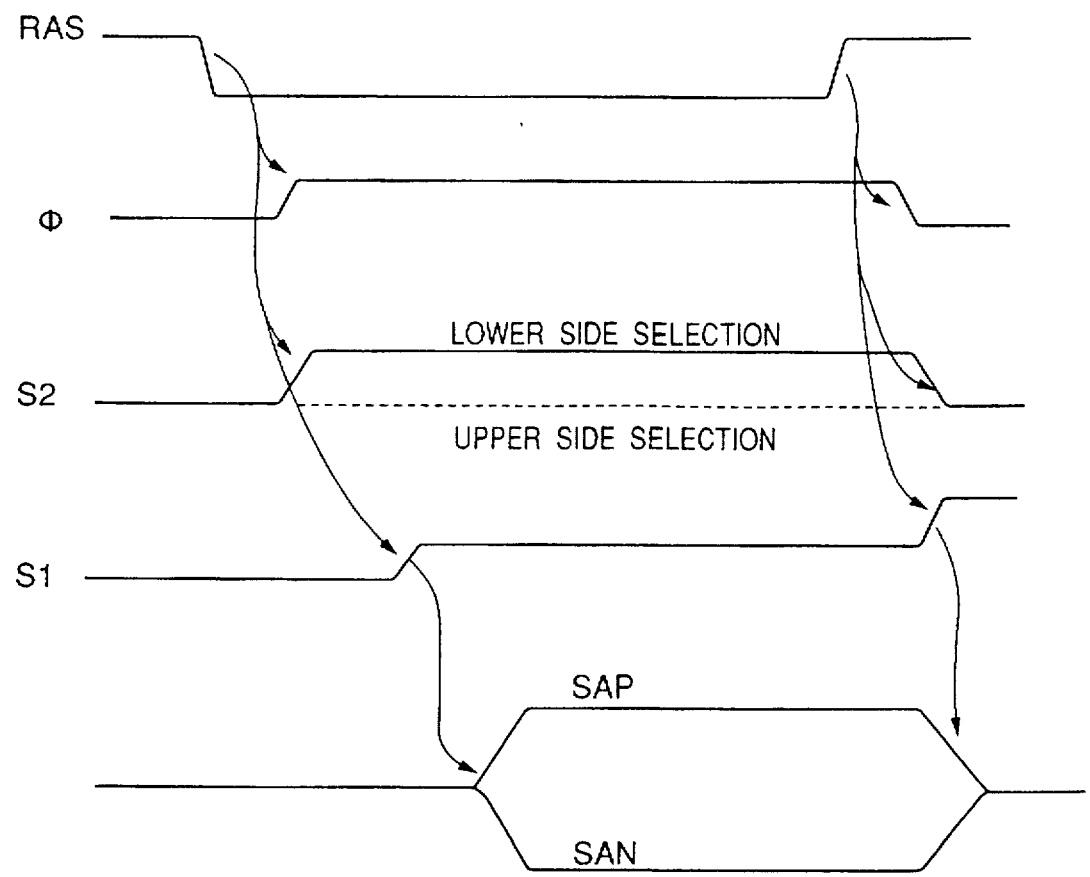
FIG. 7 is a timing chart indicative of an operation of the circuit shown in FIG. 6.

The operation in FIG. 6 will be explained while also referring to FIG. 7. When a row address strobe RAS goes low, the sense amplifier drive circuit enable signal $\phi$ goes high, and at the same time, the drive wire selection signal S2 to be supplied to the SEL carries a logical "1" or "0", in consonance with a given row address. In this embodiment, as was previously mentioned, when the drive wire (FIGS. 5 and 6) that extends downward from the sense amplifier driver SAD is selected, the drive wire selection signal S2 carries a logical "1". When the drive wire (FIGS. 5 and 6) that extends upward from the sense amplifier driver SAD is selected, the drive wire selection signal S2 carries a "0".

When the level of the word line is increased, and when the time for the transmission of cell data to the bit line has elapsed, the driver selection signal S1 goes high. As a result, the sense amplifier drive signals SAP and SAN in FIG. 7 are output to one of drive wires that extend upward or downward in FIGS. 5 and 6. The cell data are amplified during a period in which the sense amplifier drive signals SAP and SAN are being output.

When the above described arrangement for switching the output of a single sense amplifier driver SAD is employed, the area of the chip can be reduced, compared with when two sense amplifier drivers are provided, as is shown in FIGS. 1 and 4, and the manufacturing costs can be reduced.

Since also in this arrangement the length of the sense amplifier drive wire can also be shortened by half, the same effect as is obtained when sense amplifier drive wires are formed of aluminum can be obtained when they are formed of tungsten that has a high resistivity. Furthermore, the number of manufacturing procedures can be reduced.

According to the present invention, since a memory cell area that can be driven by a predetermined number of sense amplifiers is divided into two sense amplifier areas, and since sense amplifier drivers are provided for the respective sense amplifier drivers, the length of the sense amplifier drive wires that extend from the sense amplifier driver to the sense amplifier areas can be reduced. When the sense amplifier drive wires are formed of aluminum, a drive delay originating at the sense amplifier driver can be reduced. But even when the sense amplifier drive wires are formed of tungsten, a semiconductor memory device can be provided that is not affected by the high resistivity of tungsten.

What s claimed is:

1. A semiconductor memory device comprising a plurality of memory cell array blocks, at least one of said memory cell array blocks including a plurality of memory cells, a plurality of sense amplifiers, said plurality of sense amplifiers being divided into first and second groups, the sense amplifiers in said first group being activated by a first sense-enable signal, the sense amplifiers in said second group being activated by a second sense-enable signal, a first wiring layer provided to be connected to each of the sense amplifiers in said first group to convey said first sense-enable signal, a second wiring layer provided independently of said second wiring layer and connected to each of the sense amplifiers in said second group to convey said second sense-enable signal, and a driver circuit provided between said first and second wiring layers and generating said first and second sense-enable signals.

2. The device as claimed in claim 1, wherein said driver circuit includes a first driver generating said first sense-enable signal and a second driver generating said second sense-enable signal, said first and second wiring layers being arranged substantially in line in a first direction, said first and second drivers being arranged substantially in line in said first direction between said first and second wiring layers.

3. The device as claimed in claim 1, wherein said driver circuit includes a first driver generating said first sense-enable signal and a second driver generating said second sense-enable signal, said first and second wiring layers being arranged substantially in line in a first direction, said first and second drivers being arranged substantially in line in a second direction crossing said first direction.

4. The device as claimed in claim 1, wherein said driver circuit includes a driver generating third sense-enable signal and a selector taking a first state to transfer said third sense-enable signal as said first sense-enable signal and a second state to transfer said third sense-enable signal as said second sense-enable signal.

* * * * *